United States Patent
Yamashita

(10) Patent No.: US 9,252,732 B2
(45) Date of Patent: Feb. 2, 2016

(54) ACOUSTIC WAVE DEVICE AND METHOD FOR MANUFACTURING THE SAME

(75) Inventor: Takashi Yamashita, Kanagawa (JP)

(73) Assignee: TAIYO YUDEN CO., LTD., Tokyo (JP)

(*) Notice: Subject to any disclaimer, the term of this patent is extended or adjusted under 35 U.S.C. 154(b) by 514 days.

(21) Appl. No.: 13/367,836

(22) Filed: Feb. 7, 2012

(65) Prior Publication Data

US 2012/0200371 A1    Aug. 9, 2012

(30) Foreign Application Priority Data

Feb. 9, 2011 (JP) ................. 2011-026534

(51) Int. Cl.
| | |
|---|---|
| H03H 9/72 | (2006.01) |
| H01L 41/22 | (2013.01) |
| H03H 9/64 | (2006.01) |
| H01L 41/047 | (2006.01) |
| H03H 3/08 | (2006.01) |
| H03H 9/02 | (2006.01) |

(52) U.S. Cl.
CPC ............. *H03H 3/08* (2013.01); *H03H 9/0222* (2013.01); *H03H 2250/00* (2013.01); *Y10T 29/42* (2015.01)

(58) Field of Classification Search
CPC ....... H03H 3/02; H03H 3/04; H03H 9/02228; H03H 9/54; H03H 3/08
USPC .......................................... 333/133
See application file for complete search history.

(56) References Cited

U.S. PATENT DOCUMENTS

| | | | |
|---|---|---|---|
| 5,446,330 A | 8/1995 | Eda et al. | |
| 2002/0089393 A1* | 7/2002 | Tikka et al. | 333/133 |
| 2008/0061657 A1 | 3/2008 | Matsuda et al. | |
| 2008/0067896 A1* | 3/2008 | Inoue et al. | 310/335 |
| 2008/0150652 A1* | 6/2008 | Itou | 333/133 |
| 2010/0157858 A1* | 6/2010 | Lee et al. | 370/297 |
| 2010/0327995 A1 | 12/2010 | Reinhardt et al. | |
| 2012/0032753 A1 | 2/2012 | Nishimura et al. | |

FOREIGN PATENT DOCUMENTS

| | | |
|---|---|---|
| JP | H05-304436 A | 11/1993 |
| JP | 06-326553 A | 11/1994 |
| JP | 07-154199 A | 6/1995 |
| JP | 07-283688 A | 10/1995 |
| JP | 2000341068 A * | 12/2000 |
| JP | 2004-007094 A | 1/2004 |
| JP | 2005-260909 A | 9/2005 |

(Continued)

OTHER PUBLICATIONS

Machine translation of Ikada et al., as provided by examiner, translated: Nov. 10, 2014.*

(Continued)

*Primary Examiner* — Stephen E Jones
*Assistant Examiner* — Scott S Outten
(74) *Attorney, Agent, or Firm* — Chen Yoshimura LLP

(57) ABSTRACT

An acoustic wave device includes: a piezoelectric substrate; a dielectric layer formed on the piezoelectric substrate; and first and second comb-tooth electrodes formed on the dielectric layer, the dielectric layer having a first thickness between the first comb-tooth electrodes and the piezoelectric substrate and a second thickness between the second comb-tooth electrodes and the piezoelectric substrate, the first and second thicknesses being different from each other.

8 Claims, 11 Drawing Sheets

(56) References Cited

FOREIGN PATENT DOCUMENTS

| JP | 2008-67289 A | 3/2008 |
| JP | 2009-207075 A | 9/2009 |
| JP | 2010-252254 A | 11/2010 |
| JP | 2011-015397 A | 1/2011 |
| WO | 2009/128202 A1 | 10/2009 |
| WO | 2010/122786 A1 | 10/2010 |

OTHER PUBLICATIONS

Japanese Office Action dated Nov. 11, 2014, in a counterpart Japanese patent application No. 2011-026534.

* cited by examiner

FIG. 3

| Band | Tx (MHz) | Rx (MHz) | BANDWIDTH (MHz) | FRACTIONAL BANDWIDTH (Rx) |
|---|---|---|---|---|
| 1 | 1950 | 2140 | 60 | 2.8% |
| 2 | 1880 | 1960 | 60 | 3.1% |
| 3 | 1747.5 | 1842.5 | 75 | 4.1% |
| 4 | 1732.5 | 2132.5 | 45 | 2.1% |
| 5 | 836.5 | 881.5 | 25 | 2.8% |
| 6 | 835 | 880 | 10 | 1.1% |
| 7 | 2535 | 2655 | 70 | 2.6% |
| 8 | 897.5 | 942.5 | 35 | 3.7% |
| 9 | 1767.5 | 1862.4 | 35 | 1.9% |
| 10 | 1740 | 2140 | 60 | 2.8% |

ACOUSTIC WAVE DEVICE AND METHOD FOR MANUFACTURING THE SAME

CROSS-REFERENCE TO RELATED APPLICATION

This application is based upon and claims the benefit of priority of the prior Japanese Patent Application No. 2011-026534, filed on Feb. 9, 2011, the entire contents of which are incorporated herein by reference.

FIELD

A certain aspect of the present invention relates to an acoustic wave device and a method for manufacturing the same.

BACKGROUND

There is known an acoustic wave device configured so that an electrode such as an interdigital transducer IDT is formed on a piezoelectric substrate. A typical example of such a device is a surface acoustic wave (SAW) device. The electromechanical coupling coefficient, which is one of the characteristics of the acoustic wave device, depends on the material and orientation of the crystal of the piezoelectric substrate, and has a relationship with the fractional bandwidth of the acoustic wave device. There is known an art of adjusting the electromechanical coupling coefficient by changing the thickness of a dielectric layer such as a silicon oxide layer or aluminum oxide layer formed below the IDT electrode (see Japanese Patent Application Publication No. 2008-67289: Document 1).

SUMMARY OF THE INVENTION

According to an aspect of the present invention, there is provided an acoustic wave device including: a piezoelectric substrate; a dielectric layer formed on the piezoelectric substrate; and first and second comb-tooth electrodes formed on the dielectric layer, the dielectric layer having a first thickness between the first comb-tooth electrodes and the piezoelectric substrate and a second thickness between the second comb-tooth electrodes and the piezoelectric substrate, the first and second thicknesses being different from each other.

BRIEF DESCRIPTION OF THE DRAWINGS

FIG. 3 illustrates frequency bands used in an acoustic wave device in accordance with a first embodiment;

DETAILED DESCRIPTION

In the art disclosed in Document 1, the thickness of the dielectric layer formed on the piezoelectric substrate is uniform over one wafer. Thus, the electromechanical coupling coefficients of acoustic wave devices produced from the same wafer have almost the same values. It is therefore difficult to produce, from the same wafer, acoustic wave devices having different electromechanical coupling coefficients such as resonators or filters having different fractional bandwidths. There is a similar problem in devices that do not use the dielectric layer.

According to an aspect of embodiments described below, a plurality of acoustic wave devices having different electromechanical coupling coefficients are formed on a single piezoelectric substrate.

Figure 1A:
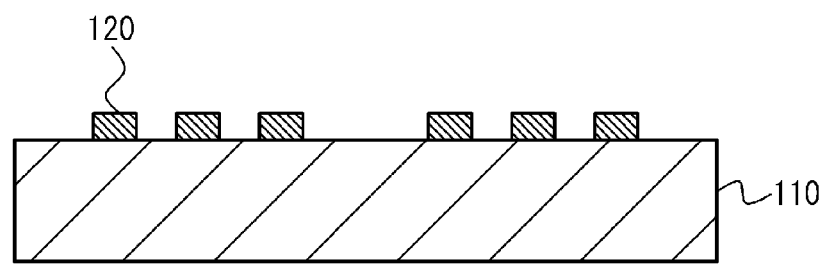
FIGS. 1A through 1C are schematic cross-sectional views of an acoustic wave device in accordance with a comparative example.
Figure 1B:
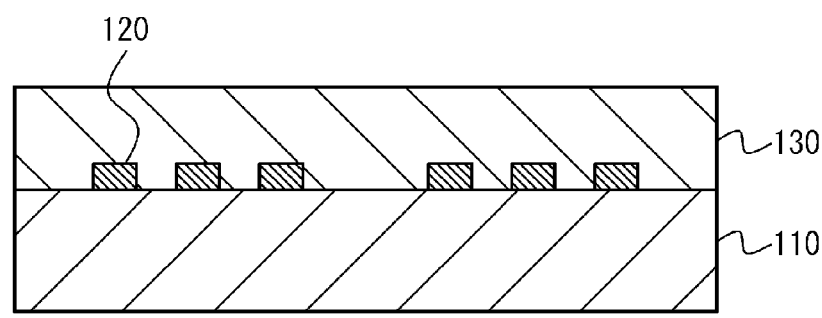
Figure 1C:
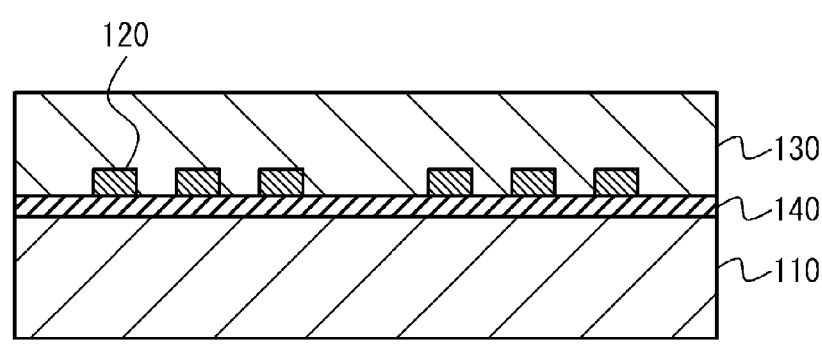

Before embodiments are described, a comparative example is now described. FIGS. 1A through 1C are schematic cross-sectional views of an acoustic wave device in accordance with a comparative example. FIG. 1A illustrates an acoustic wave device that transmits a signal by a surface acoustic wave (SAW). Comb-tooth electrodes 120 that form an IDT are formed directly on a surface of a piezoelectric substrate 110. FIG. 1B illustrates an acoustic wave device in which a thick dielectric layer is formed on an IDT. For example, the dielectric layer may have a thickness equal to a few times the thickness of the IDT. In FIG. 1B, the upper surface of the piezoelectric substrate 110 and the upper surface of the comb-tooth electrodes 120 are covered with an insulative layer 130. FIG. 1C illustrates an acoustic wave device in which a dielectric layer 140 is added to the structure illustrated in FIG. 1B so that the dielectric layer 140 is interposed between the piezoelectric substrate 110 and the comb-tooth electrodes 120.

The electromechanical coupling coefficients of the acoustic wave devices having the structures illustrated in FIGS. 1A and 1B depend on the crystal material of the piezoelectric substrate 110 and the crystal orientation thereof. In the structure illustrated in FIG. 1C, the electromechanical coupling coefficient depends on the thickness of the dielectric layer 140 in addition to the above-described factors. In each of the structures, the electromechanical coupling coefficient is almost constant in the whole area of the piezoelectric substrate 110. Thus, the structures illustrated in FIGS. 1A through 1C have a difficulty in forming acoustic wave devices having different electromechanical coupling coefficients (for example, at least two resonators or filters having different fractional bandwidths) on a single piezoelectric substrate.

First Embodiment

Figure 2:
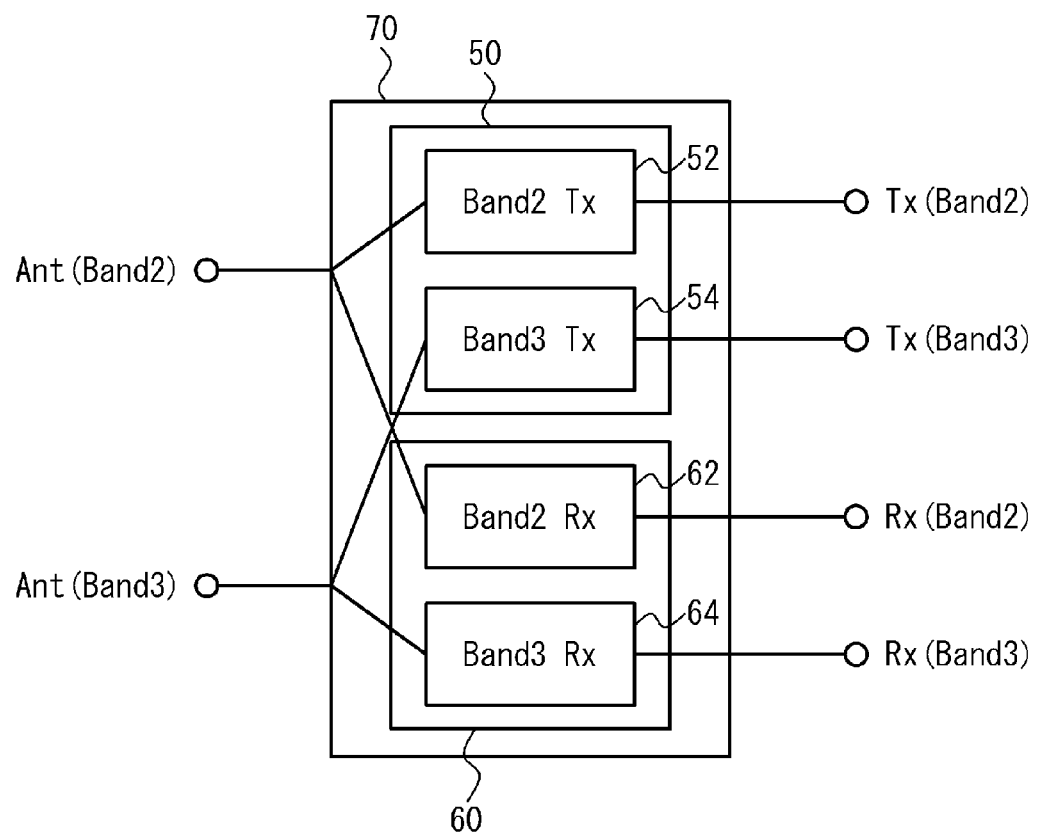
FIG. 2 is a block diagram of an acoustic wave device in accordance with a first embodiment.

FIG. 2 is a block diagram of a structure of an acoustic wave device in accordance with a first embodiment. Referring to FIG. 2, the acoustic wave device of the first embodiment includes a transmission filter part 50 and a reception filter part 60. The transmission filter part 50 includes two transmission filters having different frequency characteristics, namely, a first transmission filter 52 and a second transmission filter 54. The reception filter part 60 includes two reception filters having different frequency characteristics, namely, a first reception filter 62 and a second reception filter 64.

FIG. 3 illustrates frequency bands used in the acoustic wave device of the first embodiment. In this example, there are 10 frequency bands Band1~Band10, which have mutually different transmission frequencies Tx, reception frequencies, bandwidths (MHz), and fractional bandwidths (Rx). The fractional bandwidth is the ratio of the band width respect to the center frequency. Each of the bands has the respective fractional bandwidth. It is desirable that the electromechanical coupling coefficient of the acoustic wave device is optimized in terms of the fractional bandwidth.

In the acoustic wave device illustrated in FIG. 2, the first transmission filter 52 and the first reception filter 62 may be filters of Band2, and the second transmission filter 54 and the second reception filter 64 may be filters of Band3. These filters are provided on an identical (common) piezoelectric substrate 70. The first transmission filter 52 is connected to a transmission terminal Tx(Band2) of Band2, and the second transmission filter 54 is connected to a transmission terminal Tx(Band3) of Band3. The first reception filter 62 is connected to a reception terminal Rx(Band2) of Band2, an the second reception filter 64 is connected to a reception terminal Rx(Band3) of Band3. The first transmission filter 52 and the first reception filter 62 are connected to an antenna terminal Ant(Band2) of Band2. The second transmission filter 54 and the second reception filter 64 are connected to an antenna terminal Ant(Band3) of Band3.

Figure 4:
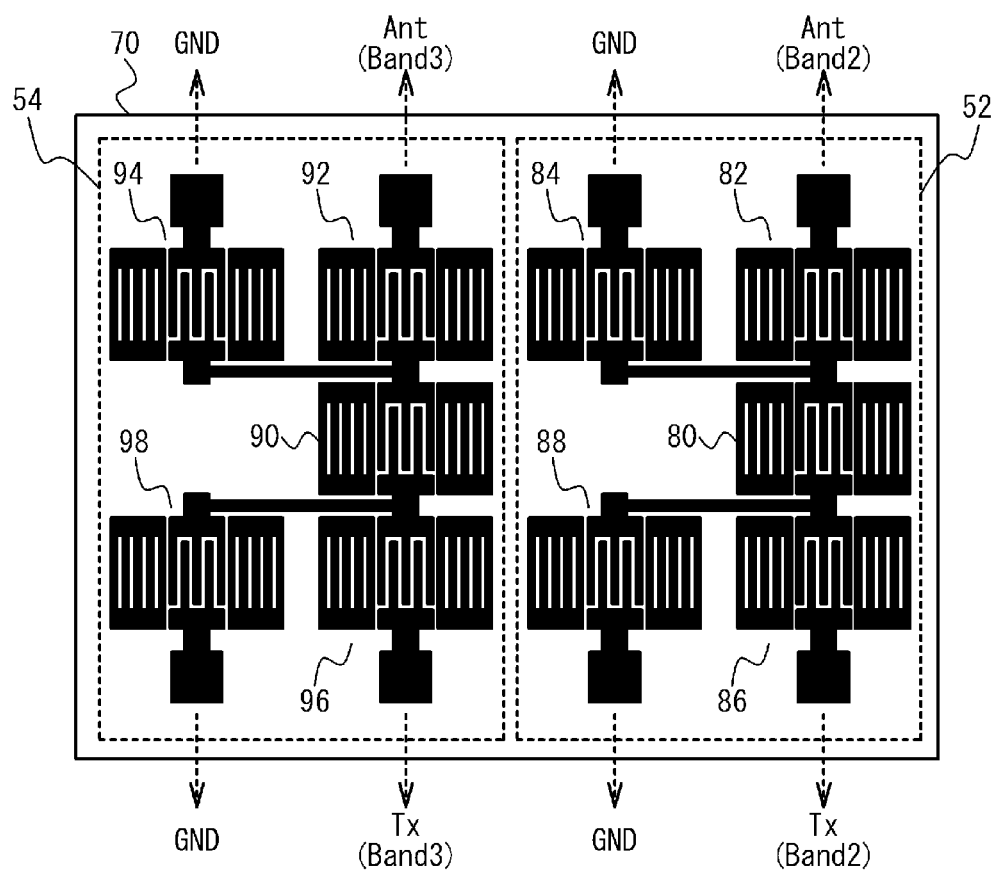
FIG. 4 is a plan view of the acoustic wave device of the first embodiment.

FIG. 4 is a schematic plan view of the acoustic wave device in accordance with the first embodiment. The first transmission filter 52 and the second transmission filter 54 having different fractional bandwidths are formed on the common piezoelectric substrate 70. Mutually different input/output systems are respectively connected to the two transmission filters 52 and 54.

The first transmission filter 52 is a ladder filter composed of three series resonators 80, 82 and 86 connected in series and two parallel resonators 84 and 88 connected in parallel. Each of the resonators 80~88 is composed of a pair of comb-tooth electrodes and two reflection electrodes at both sides of the pair of comb-tooth electrodes. One end of the series resonator 82 is connected to the antenna terminal Ant(Band2), and one end of the series resonator 86 is connected to the terminal Tx(Band2) of the transmission circuit. One end of the parallel resonator 84 is connected to the ground potential (GND), and one end of the parallel resonator 88 is connected to the ground potential (GND).

The second transmission filter 54 is a ladder filter like the first transmission filter 52 and is composed of three series resonators 90, 92 and 96 connected in series, and two parallel resonators 94 and 98 connected in parallel. Each of the resonators 90~98 is composed of a pair of comb-like electrodes and two reflection electrodes at both sides of the pair 0f comb-tooth electrodes. One end of the series resonator 92 is connected to the antenna terminal Ant(Band3), and one end of the series resonator 96 is connected to the antenna terminal Ant(Band3) of the transmission circuit. One end of the parallel resonator 94 is connected to the ground potential (GND), and one end of the parallel resonator 98 is connected to the ground potential (GND).

A method for manufacturing the acoustic wave device of the first embodiment is now described with reference to FIGS. 5A through 6D.

Figure 5A:
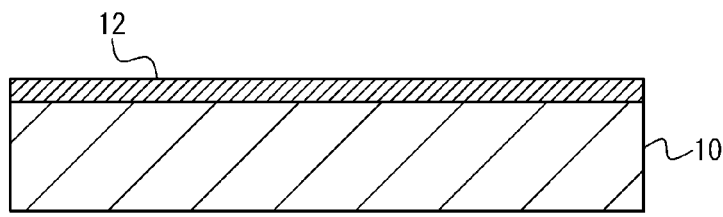
FIGS. 5A through 5E are schematic cross-sectional views of a series of steps of a method for manufacturing the acoustic wave device in accordance with the first embodiment.

Referring to FIG. 5A, a dielectric layer 12 is formed on a piezoelectric substrate 10. The piezoelectric substrate 10 may be lithium niobate ($LiNbO_3$), for example. The dielectric layer 12 may be aluminum oxide ($Al_2O_3$), for example. The thickness of the piezoelectric substrate 10 may be 200~350 μm, for example. The dielectric layer 12 may be 3~20 nm thick, for example. The dielectric layer 12 may be formed by a sputtering method, a chemical vapor deposition (CVD) method, an atomic layer deposition (ALD) method or the like.

Figure 5B:
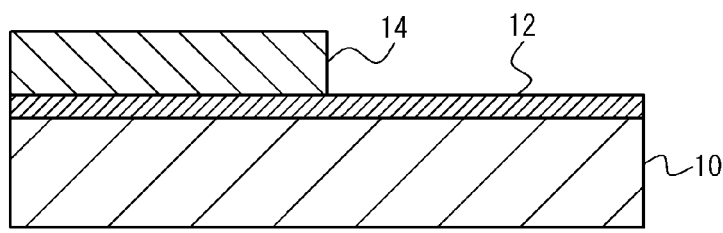

Next, referring to FIG. 5B, a mask pattern formed by a photoresist layer 14 is formed on the dielectric layer 12.

Figure 5C:
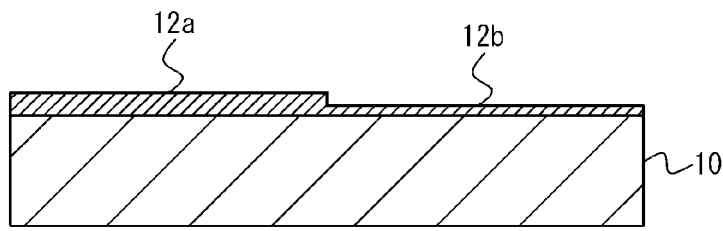

Then, referring to FIG. 5C, the dielectric layer 12 is selectively etched with the photoresist layer 14 being used as a mask, whereby the thickness of the dielectric layer 12 is selectively reduced. After the etching process, the photoresist layer 14 is removed by ashing. The selective etching of the dielectric layer 12 results in a portion 12a having no reduction in the thickness and a portion 12b having a reduced thickness.

Figure 5D:
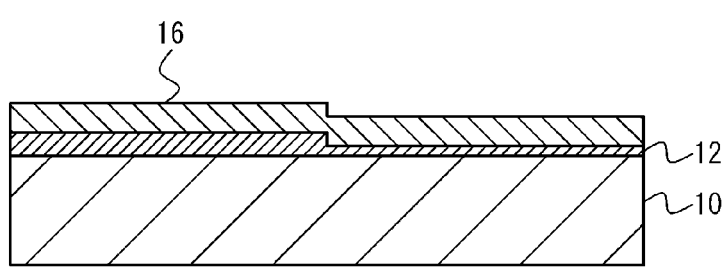

Thereafter, referring to FIG. 5D, a first insulative layer 16 is formed on the dielectric layer 12. For example, the first insulative layer 16 may be silicon oxide ($SiO_2$) and may be 80~400 nm thick.

Figure 5E:
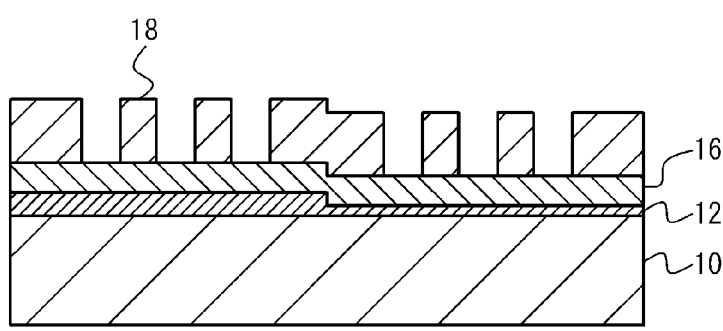

Then, referring to FIG. 5E, a mask pattern formed by a photoresist layer 18 is formed on the first insulative layer 16.

Figure 6A:
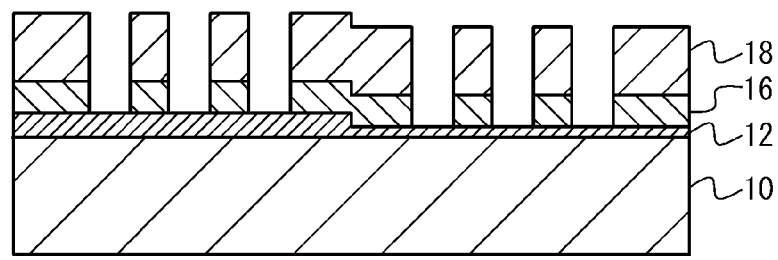
FIGS. 6A through 6D are schematic cross-sectional views of a series of steps that follows the series of steps in FIGS. 5A through 5E.

Referring to FIG. 6A, the first insulative layer 16 is selectively etched with the photoresist layer 18 being used as a mask, whereby the dielectric layer 12 is selectively exposed. In the exposed areas of the dielectric layer 12, electrode fingers of comb-tooth electrodes and reflection electrodes, which form a resonator are formed by the following process. It is to be noted that only some electrode fingers are illustrated for the sake of simplicity in the drawings. Preferably, the above etching process has a high selection ratio of the first insulative layer 16 to the dielectric layer 12 in order to the dielectric layer 12 from being overetched. In the present embodiment, the dielectric layer 12 is made of aluminum oxide and the first insulative layer 16 is made of silicon oxide.

Figure 6B:
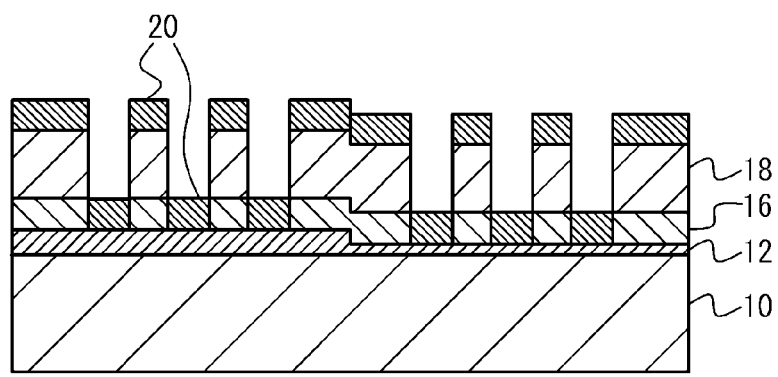

Then, referring to FIG. 6B, a metal layer 20 is formed on the photoresist layer 18 and the dielectric layer 12. The metal layer 20 may be made of copper (Cu), and may be 80 nm~400 nm thick, for example. For example, the metal layer 20 has a thickness close to that of the first insulative layer 16. The metal layer 20 may be formed by sputtering, for example.

Figure 6C:
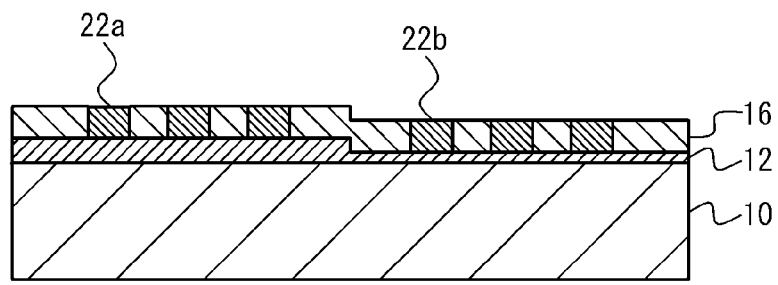
Figure 6D:
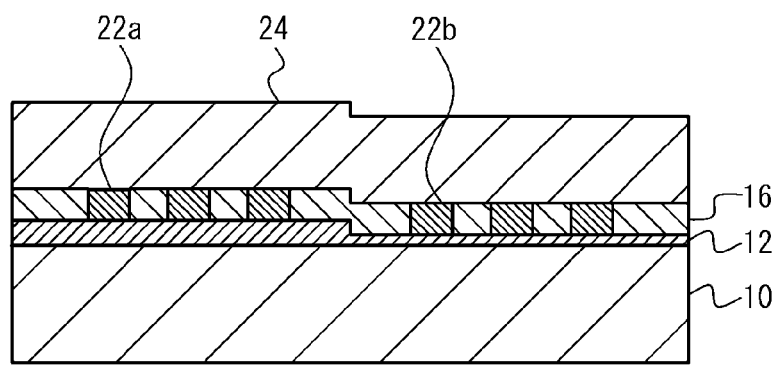

Then, a liftoff process is carried out in order to remove the photoresist layer 18 and the metal layer 20 on the photoresist layer 18. Thus, first comb-tooth electrodes 22a are formed by the metal layer 20 remaining in the first portion 12a of the dielectric layer 12, and second comb-tooth electrodes 22b are formed by the metal layer 20 remaining in the second portion 12b of the dielectric layer 12, as illustrated in FIG. 6C. The first insulative layer 16 is arranged around the first comb-tooth electrodes 22a and the second comb-tooth electrodes 22b.

After that, a second insulative layer 24 is formed so as to cover the comb-tooth electrodes 22 and the first insulative layer 16. The second insulative layer 24 may be made of silicon oxide ($SiO_2$), and may be 300 nm~1500 nm thick, for example.

Figure 7:
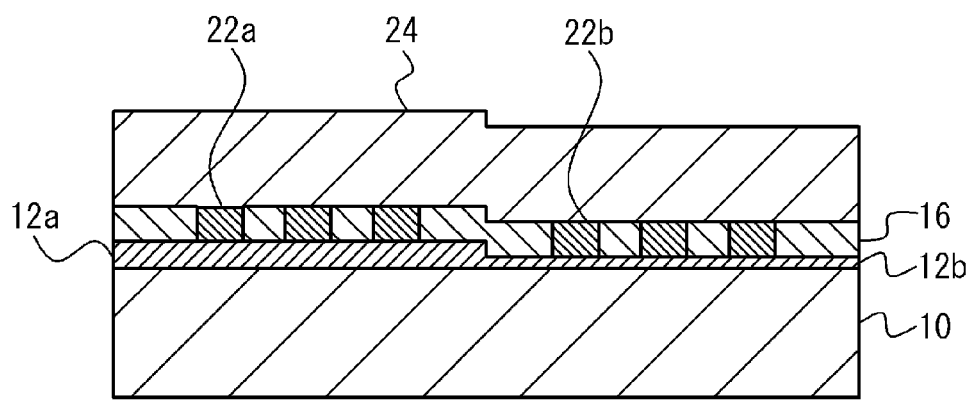
FIG. 7 is a schematic cross-sectional view of another acoustic wave device in accordance with the first embodiment.

FIG. 7 is a schematic cross-sectional view of an acoustic wave device manufactured by the above-described method in accordance with the first embodiment. The two dielectric layers having the different thicknesses are formed on the piezoelectric substrate 10. More particularly, the first portion 12a and the second portion 12b that is thinner than the first portion 12a are formed on the piezoelectric substrate 10. The first comb-tooth electrodes 22a are formed on the comparatively thick first portion 12a of the dielectric layer 12, and the second comb-tooth electrodes 22b are formed on the comparatively thin second portion 12b thereof. The side and top surfaces of the first and second comb-tooth electrodes 22a and 22b are covered with the first insulative layer 16 and the second insulative layer 24. Vibrations excited by the first and second comb-tooth electrodes 22a and 22b are propagated through the second insulative layer 24, the first insulative layer 16 and the dielectric layer 12 and are further propagated on the surface of the piezoelectric substrate 10.

The acoustic wave device having the first portion 12a and that having the second portion 12b have different electromechanical coupling coefficients because the first portion 12a and the second portion 12b have different thicknesses. It is thus possible to easily form a plurality of acoustic wave devices having different electromechanical coupling coefficients on the same or common piezoelectric substrate. For example, filters having different fractional bandwidths may be formed on the common piezoelectric substrate easily.

Figure 8:
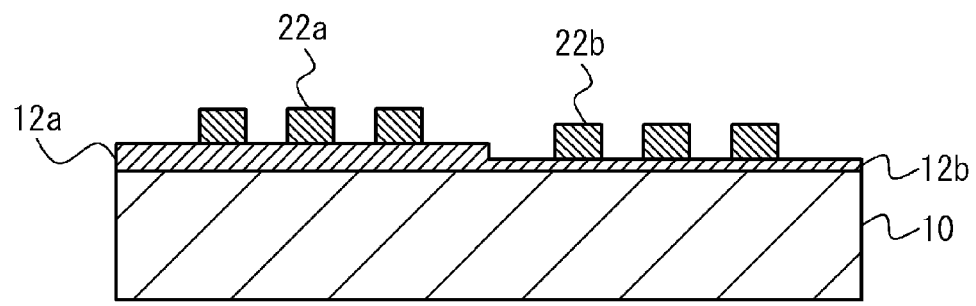
FIG. 8 is a schematic cross-sectional view of an acoustic wave device in accordance with a variation of the first embodiment.

FIG. 8 is a schematic cross-sectional view of an acoustic wave device in accordance with a variation of the first embodiment. The acoustic wave device in FIG. 8 is the same as that in FIG. 7 except that the device of FIG. 8 does not have the first insulative layer 16 and the second insulative layer 24 on the side and top surfaces of the first and second comb-tooth electrodes 22a and 22b. The acoustic wave device in FIG. 8 is a SAW device in which vibration excited by the first and second comb-tooth electrodes 22a and 22b are propagated on the surface of the dielectric layer 12, more particularly, on the first portion 12a and the second portion 12b. As described above, the structure of the first embodiment may be applied to any acoustic wave device configured so that the comb-tooth electrodes are formed on the dielectric layer 12 on the piezoelectric substrate 10.

Second Embodiment

A second embodiment has another structure of a dielectric layer having different thickness portions.

FIGS. 9A through 11B are diagrams that illustrate a method for manufacturing an acoustic wave device in accordance with the second embodiment.

Figure 9A:
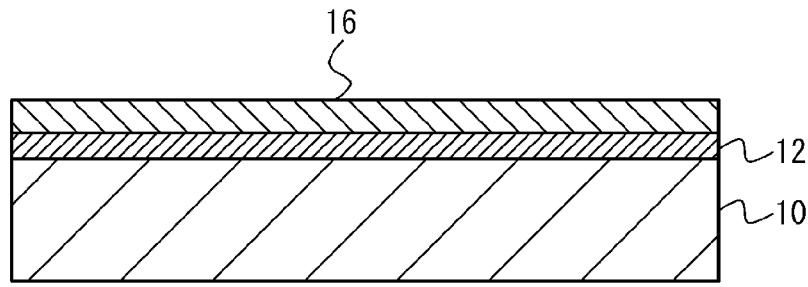
FIGS. 9A through 9D are schematic cross-sectional views of a series of steps of a method for manufacturing the acoustic wave device in accordance with the second embodiment.

Referring to FIG. 9A, the dielectric layer 12 is formed on the piezoelectric substrate 10, and the first insulative layer 16 is formed on the dielectric layer 12. Like the first embodiment, the piezoelectric substrate 10 may be made of lithium niobate, and the second dielectric layer 12 may be made of aluminum oxide. The first insulative layer may be made of silicon oxide.

Figure 9B:
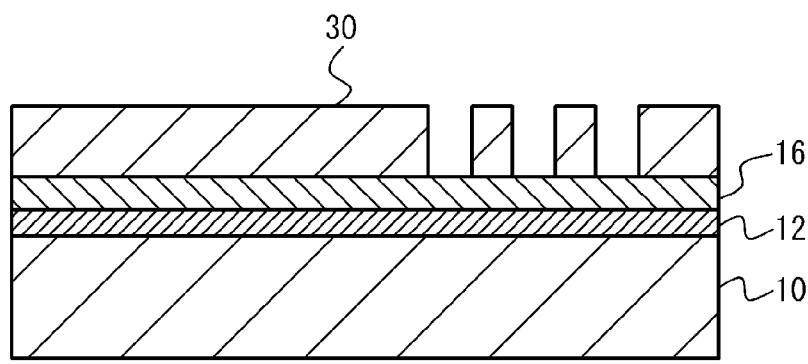

Referring to FIG. 9B, a mask pattern formed by a photoresist layer 30 is formed on the first insulative layer 16.

Figure 9C:
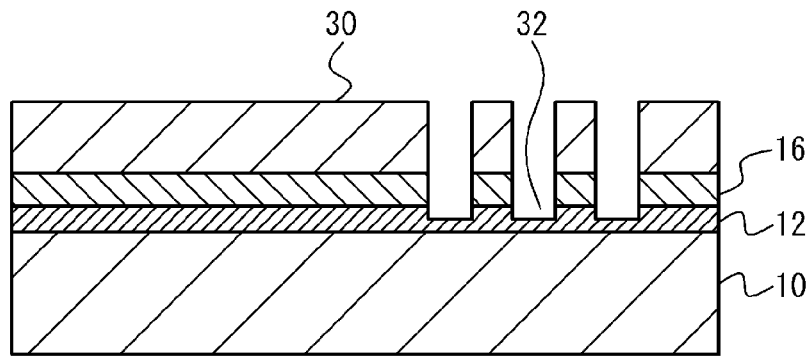

Referring to FIG. 9C, the first insulative layer 16 and the dielectric layer 12 are selectively etched in the thickness direction continuously with the photoresist layer 30 being used as a mask. Thus, the thickness of the dielectric layer 12 is selectively reduced. Portions of the dielectric layer 12 having a reduced thickness form grooves (recess portions) in which comb-tooth electrodes are arranged, as will be described later.

Figure 9D:
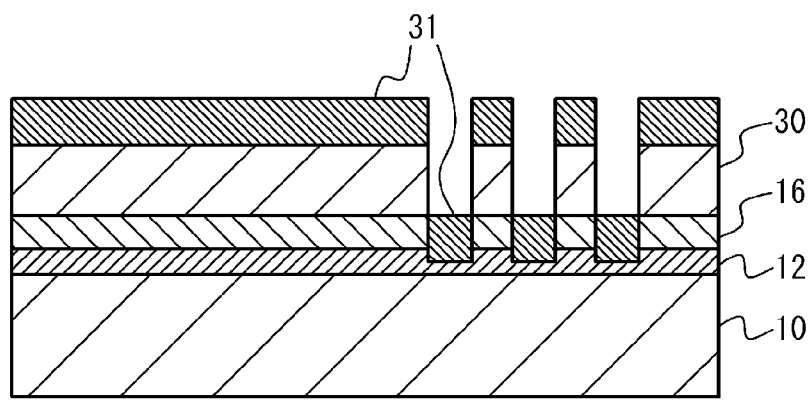

Then, referring to FIG. 9D, a metal layer 31 is formed on the photoresist layer 30 and exposed surface portions of the dielectric layer 12 from which the first insulative layer 16 has been removed. The metal layer 31 may be made of copper, and may have a thickness close to that of the first insulative layer 16. The metal layer 31 may be formed by sputtering, for example.

Figure 10A:
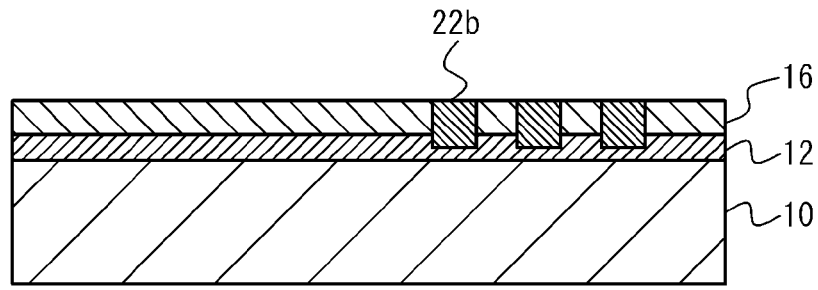
FIGS. 10A through 10D are schematic cross-sectional views of a series of steps that follows the series of steps illustrated in FIGS. 9A through 9D.

Thereafter, the photoresist layer 30 and the metal layer 31 on the photoresist layer 30 are removed by liftoff. Thus, as illustrated in FIG. 10A, the second comb-tooth electrodes 22b are formed in the grooves in the dielectric layer 12 so as to have a thickness almost equal to the depth of the grooves. The top surfaces of the second comb-tooth electrodes 22b are flush with the top surface of the first insulative layer 16. The second comb-tooth electrodes 22b are surrounded by the first insulative layer 16.

Figure 10B:
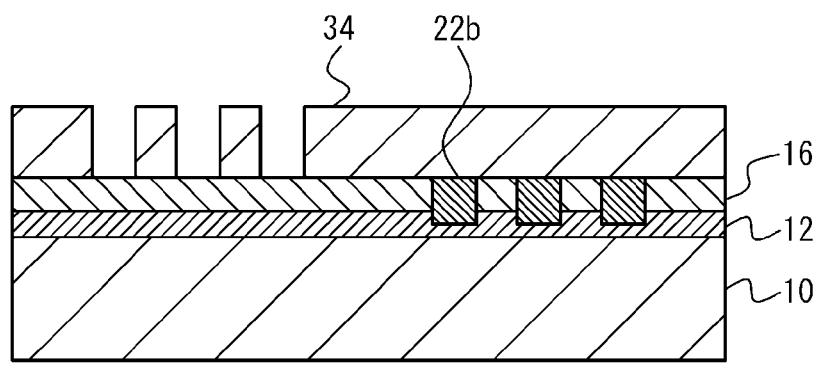

Referring to FIG. 10B, a mask pattern formed by a photoresist layer 34 is formed on the first insulative layer 16. The photoresist layer 34 does not have openings above the second comb-tooth electrodes 22b.

Figure 10C:
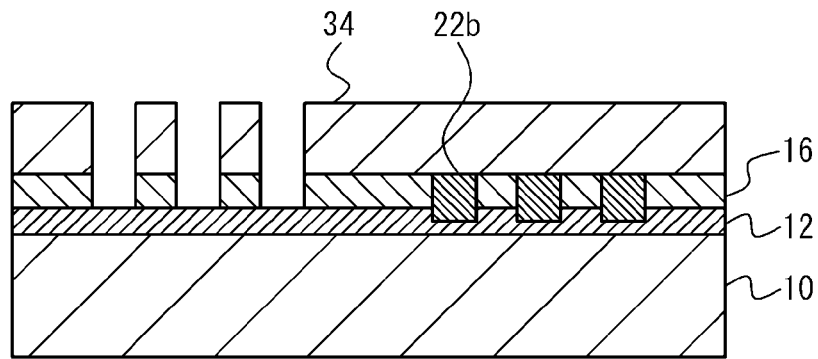

Referring to FIG. 10C, the first insulative layer 16 is selectively etched with the photoresist layer 34 being used as a mask, whereby openings that reach the surface of the dielectric layer 12 are formed in the first insulative layer 16. Preferably, the above etching process has a high selection ratio of the first insulative layer 16 to the dielectric layer 12 in order to the dielectric layer 12 from being overetched. In the present embodiment, the dielectric layer 12 is made of aluminum oxide and the first insulative layer 16 is made of silicon oxide. The removed portions of the first insulative layer 16 form grooves (recess portions) in which the first comb-tooth electrodes 22a are formed.

Figure 10D:
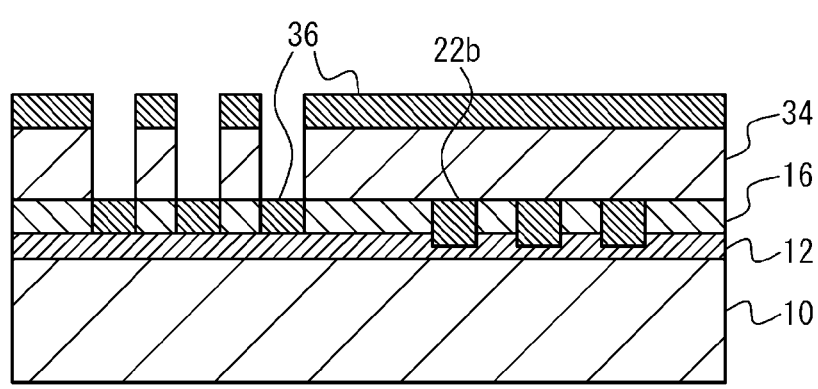

Referring to FIG. 10D, a metal layer 36 is formed on the photoresist layer 34 and the exposed surface portions of the dielectric layer 12 from which the first insulative layer 16 has been removed. The metal layer 36 may be made of copper, and may have a thickness close to the depth of the grooves. The top surfaces of the second comb-tooth electrodes 22b are flush with the top surface of the first insulative layer 16. The metal layer 36 may be formed by sputtering, for example.

Figure 11A:
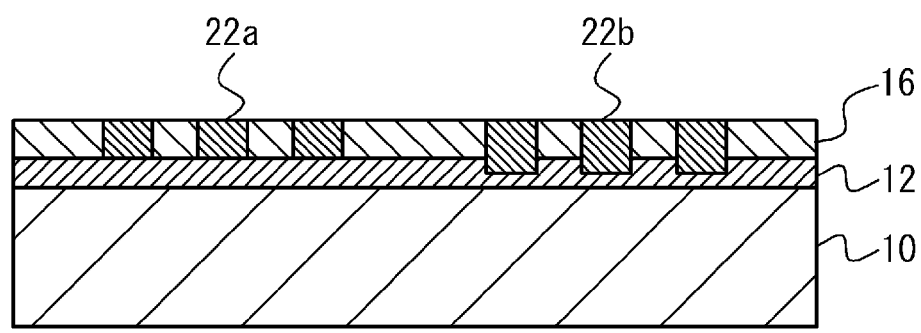
FIGS. 11A and 11B are schematic cross-sectional views of a series of steps that follows the series of steps illustrated in FIGS. 10A through 10D.

Then, the photoresist layer 34 and the metal layer 36 on the photoresist layer 34 are removed by liftoff. Thus, as illustrated in FIG. 11A, the first comb-tooth electrodes 22a having a thickness close to that of the first insulative layer 16 are formed on the dielectric layer 12. The first comb-tooth electrodes 22a are surrounded by the first insulative layer 16.

Figure 11B:
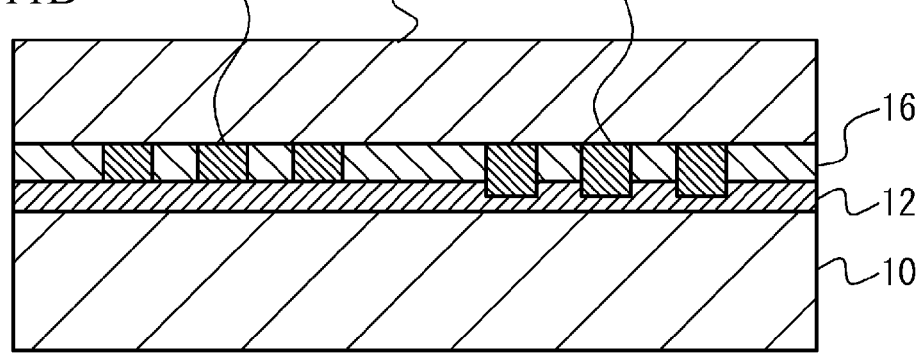

Then, referring to FIG. 11B, the second insulative layer 24 is formed so as to cover the first and second comb-tooth electrodes 22a and 22b and the first insulative layer 16. The second insulative layer 24 may be made of silicon oxide ($SiO_2$) and may be 300 nm~1500 nm thick, for example. Before forming the second insulative layer 24, an insulative layer serving as an underlying layer is formed, and the silicon oxide layer may be formed thereof. The use of the underlying layer is capable of preventing or suppressing scattering of the electrode material. The underlying layer may be made of silicon nitride (SiN) or silicon carbide (SiC).

Figure 12:
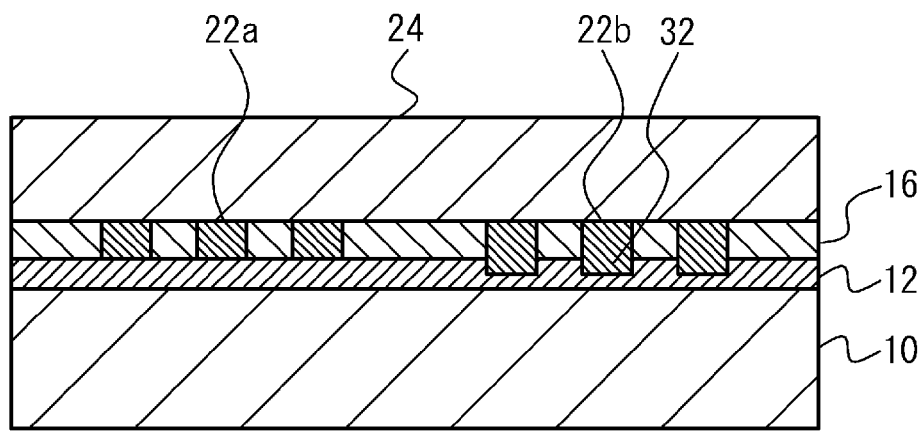
FIG. 12 is a schematic cross-sectional view of the acoustic wave device of the second embodiment.

FIG. 12 is a schematic cross-sectional view of an acoustic wave device that is manufactured by the above-mentioned method of the second embodiment. Referring to FIG. 12, the second comb-tooth electrodes 22b are formed in recess portions 32 in the dielectric layer 12, and the first comb-tooth electrodes 22a are formed on the dielectric layer 12 and located in an area other than the area in which the second comb-tooth electrodes 22b are formed. The first insulative layer 16 surrounds the side surfaces of the first and second comb-tooth electrodes 22a and 22b, and the second insulative layer 24 surrounds the top surfaces of the first and second comb-tooth electrodes 22*a* and 22*b*. Vibrations excited by the first and second comb-tooth electrodes 22*a* and 22*b* are propagated through the second insulative layer 24, the first insulative layer 16 and the dielectric layer 12 and are further propagated on the surface of the piezoelectric substrate 10.

In the acoustic wave device of the second embodiment, the thickness of the dielectric layer 12 between the first comb-tooth electrodes 22*a* and the piezoelectric substrate 10 is larger than that between the second comb-tooth electrodes 22 and the piezoelectric substrate 10. Therefore, the acoustic wave device including the first comb-tooth electrodes 22*a* and that including the second comb-tooth electrodes 22*b* have mutually different electromechanical coupling coefficients. According to the second embodiment, a plurality of acoustic wave devices having different electromechanical coupling coefficients can be formed on a single chip or a single piezoelectric substrate. For example, filters having different fractional bandwidths can be formed on the single chip.

Figure 13:
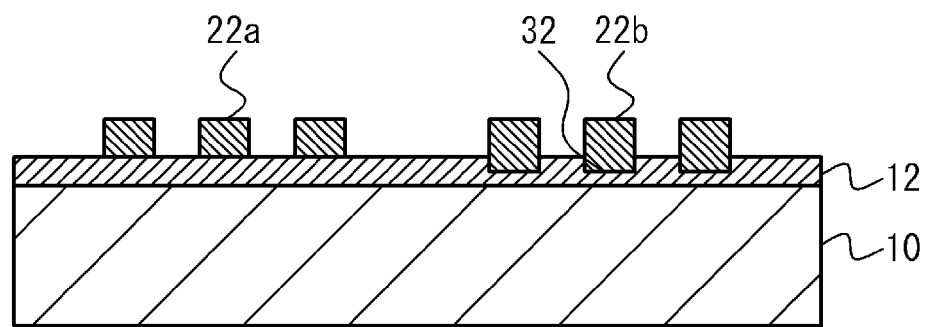
FIG. 13 is a schematic cross-sectional view of an acoustic wave device in accordance with a variation of the second embodiment.

FIG. 13 is a schematic cross-sectional view of an acoustic wave device in accordance with a variation of the second embodiment. This variation is the same as the structure illustrated in FIG. 12 except that the insulative layers are not formed on the side and top surfaces of the first and second comb-tooth electrodes 22*a* and 22*b*. Vibrations excited by the first and second comb-tooth electrodes 22*a* and 22*b* are propagated on the surface of the dielectric layer 12. The structure of the second embodiment can be applied to any acoustic wave devices configured so that the comb-tooth electrodes are formed on the dielectric layer 12 on the piezoelectric substrate 10.

In the acoustic wave device of the first embodiment, the dielectric layer 12 on the piezoelectric substrate 10 has the first portion 12*a* on which the first comb-tooth electrodes 22*a* are formed and the second portion 12*b* on which the second comb-tooth electrodes 22*b* are formed, the first portion 12*a* and the second portion 12*b* having the different thicknesses. The second portion 12*b* of the dielectric layer 12 on which the second comb-tooth electrodes 22*b* are formed has the uniform thickness. Further, the electrode fingers of the second comb-tooth electrodes 22*b* and spaces between the electrode fingers are on the second portion 12*b*.

In the acoustic wave device of the second embodiment, the portion of the dielectric layer 12 on which the second comb-tooth electrodes 22*b* are formed has the recess portions or grooves 32 having the selectively reduced thickness in which the second comb-tooth electrodes 22*b* are formed. The width of the recess portions or grooves 32 corresponds to the width of the electrode fingers. The bottoms of the electrode fingers 22*b* are located on the bottoms of the recess portions or grooves 32.

In the first and second embodiments, the thickness of the first portion 12*a* between the first comb-tooth electrodes 22*a* and the piezoelectric substrate 10 and the thickness of the second portion 12*b* between the second comb-tooth electrodes 22*b* and the piezoelectric substrate 10 are different from each other. This difference in the thickness results in acoustic wave devices having different electromechanical coupling coefficients on the single piezoelectric substrate 10.

It is thus possible to easily optimize the electromechanical coupling coefficients on the acoustic wave devices on the single piezoelectric substrate by taking into consideration the fractional bandwidths of the filters formed on the piezoelectric substrate. Thus, it is possible to realize the acoustic wave device having the multiple filters having the respective fractional bandwidths on the single piezoelectric substrate. The first comb-tooth electrodes 22*a* on the first portion 12*a* of the dielectric layer and the second comb-tooth electrodes 22*b* on the second portion 12*b* thereof are connected to input/output terminals of different signal systems. For example, the first comb-tooth electrodes 22*a* are connected to the first input terminal or the first output terminal, and the second comb-tooth electrodes 22*b* are connected to the second input terminal or the second output terminals.

The first and second embodiments are not limited to the acoustic wave devices in which the comb-tooth electrodes are formed on the dielectric layer 12. The first and second embodiments include an acoustic wave device in which electrodes are formed on the dielectric layer 12 having the different thickness portions capable of realizing the different electromechanical coupling coefficients.

The first and second embodiments are not limited to the structure that uses the relatively thick dielectric or insulative layer provided on the SAW propagation area, particularly, IDT. The first and second embodiments include acoustic wave devices using boundary acoustic waves. For example, in FIG. 7, yet another insulative layer may be provided on the second insulative layer 24, whereby the acoustic wave is propagated on the interface between the two insulative layers.

The first and second embodiments are not limited to the ladder filters (FIG. 4) but includes other types of filters such as multimode filters.

The present invention is not limited to the specifically disclosed embodiments but other variations and embodiments may be made without departing from the scope of the present invention.

What is claimed is:

1. An acoustic wave device comprising:
a piezoelectric substrate;
a dielectric layer formed on an upper surface of the piezoelectric substrate;
a first transmission filter that is connected between a first transmission terminal and a first antenna terminal and that includes first comb-tooth electrodes formed on an upper surface of the dielectric layer;
a second transmission filter that is connected between a second transmission terminal and a second antenna terminal and that includes second comb-tooth electrodes formed on the upper surface of the dielectric layer;
a first reception filter that is connected between a first reception terminal and the first antenna terminal; and
a second reception filter that is connected between a second reception terminal and the second antenna terminal,
wherein the dielectric layer has a first thickness between a lower surface of the first comb-tooth electrodes and the upper surface of the piezoelectric substrate and has a second thickness between a lower surface of the second comb-tooth electrodes and the upper surface of the piezoelectric substrate, the first and second thicknesses being different from each other,
wherein the first comb-tooth electrodes and the second comb-tooth electrodes excite a surface acoustic wave or a boundary acoustic wave propagated on a surface of the dielectric layer.

2. The acoustic wave device according to claim 1, further comprising an insulative layer provided so as to cover the dielectric layer, the first comb-tooth electrodes and the second comb-tooth electrodes.

3. The acoustic wave device according to claim 2, wherein the insulative layer includes silicon oxide.

4. The acoustic wave device according to claim 1, wherein the dielectric layer has a first portion on which the first comb-tooth electrodes are formed, and a second portion on which the second comb-tooth electrodes are formed, the second portion having a thickness smaller than that of the first portion, and wherein electrode fingers of the second comb-tooth electrodes and spaces between the electrode fingers are located on the second portion of the dielectric layer.

5. The acoustic wave device according to claim 1, wherein the dielectric layer has recess portions having a width corresponding to that of electrode fingers of the second comb-tooth electrodes, the electrode fingers of the second comb-tooth electrodes are formed in the recess portions, and electrode fingers of the first comb-tooth electrodes are formed in areas other than areas in which the recess portions are formed.

6. The acoustic wave device according to claim 1, wherein the dielectric layer includes aluminum oxide.

7. The acoustic wave device according to claim 1, wherein the first transmission filter uses a first frequency band that is any one of Band 1 through Band 10, and the second transmission filter uses a second frequency band that is another one of Band 1 through Band 10, and the first transmission filter and the second transmission filter have different fractional bandwidths.

8. The acoustic wave device according to claim 1, wherein the first transmission filter includes a first series resonator and a first parallel resonator, the second transmission filter includes a second series resonator and a second parallel resonator, each of the first series resonator and the first parallel resonator includes the first comb-tooth electrodes, and each of the second series resonator and the second parallel resonator includes the second comb-tooth electrodes.

* * * * *